(12) United States Patent
Oishi et al.

(10) Patent No.: US 7,871,554 B2
(45) Date of Patent: Jan. 18, 2011

(54) PROCESS FOR PRODUCING POLYIMIDE FILM

(75) Inventors: Jitsuo Oishi, Kanagawa (JP); Takashi Makinoshima, Kanagawa (JP); Ko Kedo, Tokyo (JP); Shuta Kihara, Kanagawa (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 95 days.

(21) Appl. No.: 11/911,260

(22) PCT Filed: Apr. 10, 2006

(86) PCT No.: PCT/JP2006/307546

§ 371 (c)(1), (2), (4) Date: Nov. 12, 2008

(87) PCT Pub. No.: WO2006/112286

PCT Pub. Date: Oct. 26, 2006

(65) Prior Publication Data

US 2009/0160089 A1   Jun. 25, 2009

(30) Foreign Application Priority Data

Apr. 14, 2005   (JP) .............................. 2005-117193

(51) Int. Cl.
*B29C 55/02* (2006.01)
*D02J 1/22* (2006.01)

(52) U.S. Cl. ................. 264/289.6; 264/204; 264/210.5; 264/288.4

(58) Field of Classification Search ............... 264/289.6, 264/204, 210.5
See application file for complete search history.

(56) References Cited

U.S. PATENT DOCUMENTS

| 3,867,500 | A | * | 2/1975 | Traynor ..................... 264/216 |
| 4,725,484 | A | * | 2/1988 | Kumagawa et al. ......... 428/220 |
| 5,324,475 | A | * | 6/1994 | Okahashi et al. ............ 264/555 |

| 2003/0104232 | A1 |   | 6/2003 | Kihara et al. |
| 2004/0126600 | A1 | * | 7/2004 | Dunbar et al. ........... 428/473.5 |
| 2005/0037213 | A1 |   | 2/2005 | Kihara et al. |

FOREIGN PATENT DOCUMENTS

| JP | 2003-141936 | 5/2003 |
| JP | 2003-176370 | 6/2003 |
| JP | 2004-111152 | 4/2004 |
| JP | 2004-224810 | 8/2004 |
| JP | 2004-359941 | 12/2004 |
| JP | 2005-001380 | 1/2005 |

* cited by examiner

*Primary Examiner*—Philip C Tucker
*Assistant Examiner*—Alison Hindenlang
(74) *Attorney, Agent, or Firm*—Antonelli, Terry, Stout & Kraus, LLP.

(57) ABSTRACT

The invention is directed to a process for producing polyimide film, including stretching, at 150° C. to 380° C. and a stretch ratio of 1.2 to 4.0, an unstretched polyimide film which is formed from a polyimide having a repeating unit represented by formula (1):

[F1]

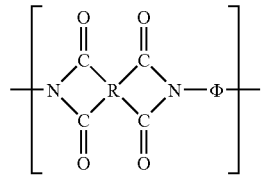

(1)

(wherein R represents a tetravalent group derived from cyclohexane; and Φ represents a divalent aliphatic, alicyclic, or aromatic group, or a combination thereof that has a total number of carbon atoms of 2 to 39 and may have at least one connecting group selected from the group consisting of —O—, —SO$_2$—, —CO—, —CH$_2$—, —C(CH$_3$)$_2$—, —OSi(CH$_3$)$_2$—, —C$_2$H$_4$O—, and —S—) and which has an organic solvent content of 0.5 wt. % or more and less than 30 wt. %. The produced polyimide film exhibits transparency, excellent heat resistance, and reduced dimensional changes.

12 Claims, No Drawings

PROCESS FOR PRODUCING POLYIMIDE FILM

TECHNICAL FIELD

The present invention relates to a process for producing polyimide film which exhibits excellent transparency and heat resistance and reduced dimensional changes.

BACKGROUND ART

Hitherto, polyimides have been widely employed as molding materials, composite materials, electrical and electronic parts, etc., by virtue of excellent heat resistance as well as excellent properties such as mechanical characteristics, resistance to chemicals, electric characteristics, etc. In recent years, electrical and electronic devices have been drastically down-sized, thinned, and reduced in weight, and plastic film parts for use in the devices are required to have higher long-term reliability in terms of heat resistance, mechanical properties, and dimensional stability.

One known technique for enhancing mechanical properties and dimensional stability of polyimide film in a plane direction is stretching of unstretched polyimide film. For example, Patent Document 1 discloses a technique for enhancing dimensional stability. In the disclosed technique, a polyamic acid solution produced through reaction between aromatic tetracarboxylic dianhydride and aromatic diamine is applied onto a flat plate to form film; the film is heated so as to gradually evaporate the solvent, thereby forming polyimide precursor film; the precursor film is thermally or chemically imidized to thereby form polyimide film; and the polyimide film is drawn at a temperature not lower than the glass transition temperature.

Patent Document 2 discloses a technique for enhancing mechanical properties. In the disclosed technique, a melt-moldable polyimide mixture predominantly containing a polyimide formed from aromatic tetracarboxylic dianhydride and aromatic diamine is melt-extruded to form film, and the film is drawn at a temperature not lower than the glass transition temperature.

Non-Patent Document 1 discloses two different techniques for producing polyimide film having excellent mechanical properties. One technique includes stretching of a polyamic acid film formed from aromatic tetracarboxylic dianhydride and aromatic diamine and subjecting the stretched film to swelling, stretching, and heating for imidization. The other technique includes stretching of polyimide film at a high temperature falling within a glass transition temperature range.

All of the aforementioned conventional techniques are directed to stretching of polyimide films synthesized from aromatic tetracarboxylic dianhydride and aromatic diamine. These aromatic polyimides (formed of all aromatic units) synthesized from aromatic tetracarboxylic dianhydride and aromatic diamine exhibit excellent heat resistance and mechanical properties. However, these aromatic polyimides are colored (pale yellow to reddish brown) by large absorption of visible light. Since a wider variety of functions are expected in the aforementioned electrical and electronic uses, provision of transparent film exhibiting high heat resistance is envisaged.

Non-Patent Document 2 discloses that when a polyimide is produced from an alicyclic monomer, charge transfer between a tetracarboxylic dianhydride moiety and a diamine moiety; i.e., coloring, is suppressed, whereby a colorless transparent polyimide can be produced. However, there have never been reported studies on stretching of a film predominantly formed from polyimide produced from an alicyclic monomer polyimide and reduction in dimensional changes.

Patent Document 1: Japanese Patent Application Laid-Open (kokai) No. 61-296034
Patent Document 2: Japanese Patent No. 2594396
Non-Patent Document 1: "Techniques and evaluation of stretching of plastic film," Technical Information Institute Co., Ltd. p. 247-252 (1992)
Non-Patent Document 2: "New Polyimide—Fundamental and Application," edited by Japan Polyimide Association, NTS Co., Ltd. p. 387-407 (2002)

DISCLOSURE OF THE INVENTION

An object of the present invention is to provide a method for reducing dimensional changes of polyimide film produced from an aliphatic monomer, which method has not been studied hitherto. Namely, the object is to provide polyimide film exhibiting excellent heat resistance and mechanical properties, which are characteristics of polyimide per se, and having transparency and high dimensional stability.

In order to attain the aforementioned object, the present inventors have carried out extensive studies, and have found that a polyimide film which is colorless and transparent and which has high dimensional stability can be produced from a polyimide having a repeating unit including a specific alicyclic tetracarboxylic acid structure. The present invention has been accomplished on the basis of this finding.

Accordingly, the present invention is directed to a process for producing polyimide film, characterized in that the process comprises stretching, at 150° C. to 380° C. and a stretch ratio of 1.2 to 4.0, an unstretched polyimide film which is formed from a polyimide having a repeating unit represented by formula (1):

[F1]

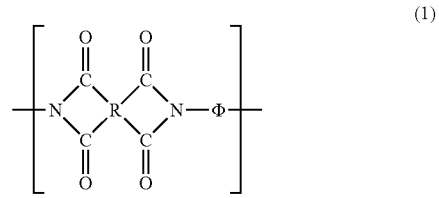

(1)

(wherein R represents a tetravalent group derived from cyclohexane; and Φ represents a divalent aliphatic, alicyclic, or aromatic group, or a combination thereof that has a total number of carbon atoms of 2 to 39 and may have at least one connecting group selected from the group consisting of —O—, —SO$_2$—, —CO—, —CH$_2$—, —C(CH$_3$)$_2$—, —OSi(CH$_3$)$_2$—, —C$_2$H$_4$O—, and —S—) and which has an organic solvent content of 0.5 wt. % or more and less than 30 wt. %.

The polyimide film produced according to the present invention can be employed as a transparent conductive film, a thin-film transistor substrate, a flexible printed wiring board, etc.

BEST MODES FOR CARRYING OUT THE INVENTION

The present invention is directed to a process for producing polyimide film formed from a polyimide having a repeating unit represented by formula (1). According to the process, a self-supporting unstretched polyimide film having a specific organic solvent content is produced from a solution of the polyimide in organic solvent, and the unstretched film is stretched, to thereby produce a polyimide film of interest. The self-supporting unstretched polyimide film has an organic solvent content of 0.5 wt. % or more and less than 30 wt. % and is stretched at 150° C. to 380° C. and a stretch ratio of 1.2 to 4.0.

Particularly when the unstretched polyimide film has an organic solvent content of 0.5 wt. % or more and less than 10 wt. %, the process for producing polyimide film preferably includes stretching the unstretched polyimide film at 220° C. to 380° C., subsequently, reducing the stretch degree of the stretched film, maintaining the film at the reduced stretch degree, heating the film to a temperature higher than the stretch temperature by 1° C. to 50° C., and maintaining the heated film for 10 seconds to 10 minutes.

Particularly when the unstretched polyimide film has an organic solvent content of 10 wt. % or more and less than 30 wt. %, the process for producing polyimide film preferably includes stretching the unstretched polyimide film at 150° C. to 300° C., subsequently, maintaining the stretch degree of the stretch film, heating to a first temperature higher than the stretch temperature and lower than the glass transition temperature of the polyimide containing virtually no organic solvent, maintaining the heated film for 30 seconds to 30 minutes, reducing the stretch degree of the heated film, maintaining the film at the reduced stretch degree, heating again to a second temperature higher than the first temperature by 1° C. to 50° C., and maintaining the heated film for 10 seconds to 10 minutes.

The polyimide film produced through the aforementioned process preferably has a linear expansion coefficient of 50 ppm/° C. or less, a moisture expansion coefficient (25° C.) of 40 ppm/% RH or less, or a tensile modulus (25° C.) of 1.7 GPa or more and a tensile strength (25° C.) of 90 MPa or more, Polyimide The polyimide employed in the present invention has a repeating unit represented by formula (1) (hereinafter referred to as polyimide A).

[F2]

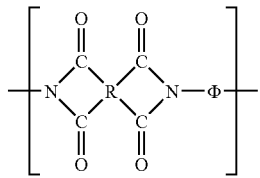

(1)

The ratio of the repeating unit represented by formula (1) to all the repeating units is generally 10 to 100 mol %, preferably 50 to 100 mol %. One polyimide molecule includes 10 to 2,000, preferably 20 to 200 repeating units represented by formula (1).

Φ in formula (1) represents a divalent aliphatic, alicyclic, or aromatic group, or a combination thereof that has a total number of carbon atoms of 2 to 39 and may have at least one connecting group selected from the group consisting of —O—, —SO$_2$—, —CO—, —CH$_2$—, —C(CH$_3$)$_2$—, —OSi(CH$_3$)$_2$—, —C$_2$H$_4$O—, and —S—.

Examples of preferred groups Φ include aliphatic structural units such as polymethylene, alkylene, oxyalkylene having an alkyl end or an aromatic end, polyoxyalkylene having an alkyl end or an aromatic end, xylylene, and alkyl-or halogen-substituted units thereof; divalent alicyclic structural units derived from a compound such as cyclohexane, dicyclohexylmethane, dimethylcyclohexane, isophorone, norbornane, or an alkyl- or halogen-substituted compound thereof; divalent aromatic structural units derived from a compound such as benzene, naphthalene, biphenyl, diphenylmethane, diphenyl ether, diphenyl sulfone, benzophenone, or an alkyl- or halogen-substituted compound thereof; and organosiloxane units having an alkyl end or an aromatic end.

Specific examples of the divalent groups are as follows

[F3]

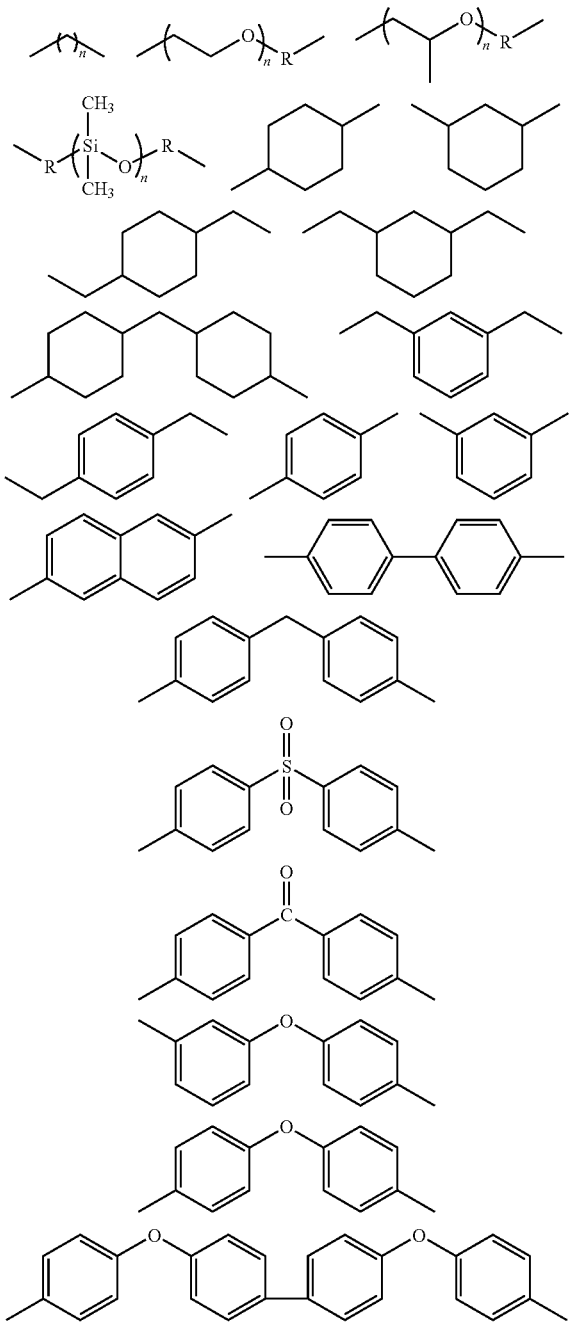

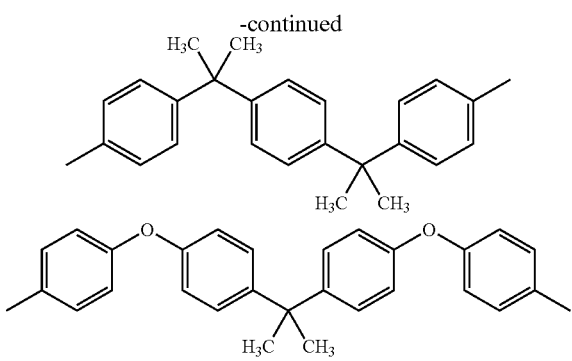

In the above structures, n denotes a repeating unit and is 1 to 5, preferably 1 to 3. R represents a C1 to C3 alkanediyl group; i.e., methylene, ethylene, trimethylene, or propane-1,2-diyl. Of these, methylene is particularly preferred.

Among these groups, the following divalent groups are particularly preferred.

[F4]

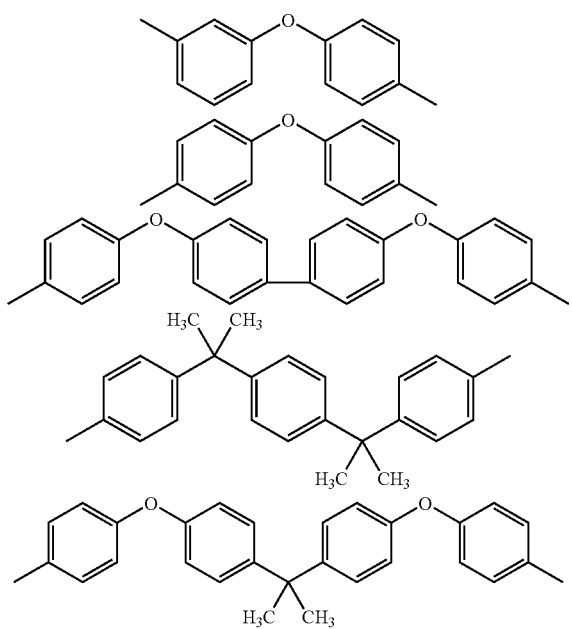

Polyimide A of the present invention is generally produced as a polyimide solution through reacting a tetracarboxylic acid component and a diamine component (diamine or a derivative thereof) in solution.

The tetracarboxylic acid component forming the unit (1) of the present invention is 1,2,4,5-cyclohexanetetracarboxylic dianhydride or a reactive derivative thereof. Examples of the component include 1,2,4,5-cyclohexanetetracarboxylic acid, 1,2,4,5-cyclohexanetetracarboxylic acid esters, and 1,2,4,5-cyclohexanetetracarboxylic dianhydride (HPMDA), with 1,2,4,5-cyclohexanetetracarboxylic dianhydride being preferred. Notably, the tetracarboxylic acid component includes isomers thereof.

So long as the solubility in solvent, film flexibility, thermal press-adhesion, and transparency of polyimide A are not impaired, the aforementioned tetracarboxylic acid component may be employed in combination with other tetracarboxylic acids or derivatives (particularly dianhydrides).

Examples of the additional acid component include at least one compound selected from pyromellitic acid, 3,3',4,4'-biphenyltetracarboxylic acid, 2,3,3',4'-biphenyltetracarboxylic acid, 2,2-bis(3,4-dicarboxyphenyl)propane, 2,2-bis(2,3-dicarboxyphenyl)propane, 2,2-bis(3,4-dicarboxyphenyl)-1,1,1,3,3,3-hexafluoropropane, 2,2-bis(2,3-dicarboxyphenyl)-1,1,1,3,3,3-hexafluoropropane, bis(3,4-dicarboxyphenyl) sulfone, bis(3,4-dicarboxyphenyl) ether, bis(2,3-dicarboxyphenyl)ether, 3,3',4,4'-benzophenonetetracarboxylic acid, 2,2',3,3'-benzophenonetetracarboxylic acid, 4,4-(p-phenylenedioxy)diphthalic acid, 4,4-(m-phenylenedioxy)diphthalic acid, ethylenetetracarboxylic acid, 1,1-bis(2,3-dicarboxyphenyl)ethane, bis(2,3-dicarboxyphenyl)methane, bis(3,4-dicarboxyphenyl)methane, and derivatives of these tetracarboxylic acids, particularly dianhydrides.

Examples of the diamine component forming nitrogen and group Φ in the imide ring in formula (1) include diamines, diisocyanates, and diaminodisilanes, with diamines being preferred. The diamine component preferably has a diamine content of 50 mol % or more (including 100 mol %).

The diamine component may be an aromatic diamine, an aliphatic diamine, or a mixture thereof. As used herein, the term "aromatic diamine" refers to a diamine in which amino groups are directly linked to an aromatic ring, and may further contain an aliphatic group, an alicyclic group, and other substituents in the structure thereof. The term "aliphatic diamine" refers to a diamine in which amino groups are directly linked to an aliphatic group or an alicyclic group, and may further contain an aromatic group or other substituents in the structure thereof.

Examples of the aliphatic diamine include 4,4'-diaminodicyclohexylmethane, ethylenediamine, hexamethylenediamine, polyethylene glycol bis(3-aminopropyl) ether, polypropylene glycol bis(3-aminopropyl)ether, 1,3-bis(aminomethyl)cyclohexane, 1,4-bis(aminomethyl)cyclohexane, m-xylylenediamine, p-xylylenediamine, isophoronediamine, norbornanediamine, and siloxanediamine.

Examples of the aromatic diamine include 3,4'-diaminodiphenyl ether, 4,4'-diaminodiphenyl ether, 4,4'-diaminodiphenylmethane, 4,4'-diaminodiphenyl sulfone, m-phenylenediamine, p-phenylenediamine, 2,4-toluenediamine, diaminobenzophenone, 2,6-diaminonaphthalene, 1,5-diaminonaphthalene, 1,4-bis(4-aminophenoxy)benzene, 1,3-bis(4-aminophenoxy)benzene, 1,3-bis(3-aminophenoxy)benzene, 4,4'-bis(4-aminophenoxy)biphenyl, α,α'-bis(3-aminophenyl)-1,4-diisopropylbenzene, bis[4-(4-aminophenoxy)phenyl]sulfone, bis[4-(3-aminophenoxy)phenyl]sulfone, α,α'-bis(4-aminophenyl)-1,4-diisopropylbenzene, and 2,2-bis(4-aminophenoxyphenyl)propane.

In the present invention, the glass transition temperature of polyimide A is predetermined mainly on the basis of the diamine selected and is generally 350° C. or lower. Polyimide A exhibits adhesion at a temperature equal to or higher than the glass transition temperature. When polyimide A has an excessively high glass transition temperature, thermal press-adhesion temperature thereof is excessively elevated, whereas when the glass transition temperature is considerably low, heat resistance of polyimide A is insufficient. Both cases are not preferred. The glass transition temperature of polyimide A is preferably selected from a range of 200 to 350° C., particularly preferably 250 to 320° C., in the case where polyimide A virtually contain no solvent.

Polyimide A of the present invention is generally produced as a solution in organic solvent.

No particular limitation is imposed on the organic solvent. Examples of employable solvents include N-methyl-2-pyrrolidone, N,N-dimethylacetamide, N,N-diethylacetamide, N,N-dimethylformamide, N,N-diethylformamide, N-methylcaprolactam, hexamethylphosphoramide, tetramethylene sulfone, dimethyl sulfoxide, m-cresol, phenol, p-chlorophenol, 2-chloro-4-hydroxytoluene, diglyme, triglyme, tetraglyme, dioxane, γ-butyrolactone, dioxorane, cyclohexanone, and cyclopentanone. These solvents may be used in combination of two or more species. However, from the viewpoint of performance of varnish formed from polyimide and solvent, N-methyl-2-pyrrolidone (NMP), N,N-dimethylacetamide (DMAC), or γ-butyrolactone (GBL) is preferably used singly or in combination.

When polyimide is produced through solution polymerization, poor solvent such as hexane, heptane, benzene, toluene, xylene, chlorobenzene, or o-dichlorobenzene may be used in addition to the aforementioned organic solvent, so long as the polymer is not precipitated.

No particular limitation is imposed on the production method for polyimide A, and polyimide A may be produced from the aforementioned tetracarboxylic dianhydride component and the diamine component. For example, there may be employed conventional processes such as (i) solution polymerization, (ii) film formation of polyamic acid and imidization, (iii) solid polymerization of an oligomer or a salt produced from a carboxylic acid component and a diamine component, and (iv) production from tetracarboxylic dianhydride and diisocyanate material. These methods may be employed in combination. Moreover, these reactions may be performed in the presence of a conventional catalyst such as acid, tertiary amine, or anhydride.

More specifically, a solution of polyimide A in organic solvent may be produced through any of the following methods (1) to (3).

(1) A tetracarboxylic acid component is added to a solution of a diamine component in organic solvent, or a diamine component is added to a solution of a tetracarboxylic acid component in organic solvent. The mixture is preferably maintained at 80° C. or lower, particularly preferably at about room temperature or lower, for 0.5 to 3 hours. To the thus-produced polyamic acid (reaction intermediate) solution, a co-boiling/dehydration solvent such as toluene or xylene was added, and the polyamic acid is dehydrated while formed water is removed to the outside through co-boiling, whereby a solution of polyimide A in organic solvent is produced.

(2) A dehydrating agent such as acetic anhydride is added to the polyamic acid (reaction intermediate) solution produced in (1) above, to thereby imidize the intermediate. A poor solvent with respect to polyimide such as methanol was added to the imidization mixture, to thereby precipitate the formed polyimide. The precipitates are collected through filtration, washed, and dried, to thereby isolate a polyimide solid. The solid is dissolved in an organic solvent, to thereby yield a solution of polyimide A in organic solvent.

(3) According to the same procedure as employed in (1) above, a polyamic acid solution is prepared by use of a high-b.p. solvent such as cresol, and the thus-prepared polyamic acid solution is maintained at 150 to 220° C. for 3 to 12 hours for imidization. A poor solvent with respect to polyimide such as methanol was added to the imidization mixture, to thereby precipitate the formed polyimide. The precipitates are collected through filtration, washed, and dried, to thereby isolate a polyimide solid. The solid is dissolved in an organic solvent such as N,N-dimethylacetamide, to thereby yield a solution of polyimide A in organic solvent.

When polyimide A of the present invention is produced through solution polymerization, a tertiary amine compound is preferably employed as a catalyst. Examples of the tertiary amine compound include trimethylamine, triethylamine (TEA), tripropylamine, tributylamine, triethanolamine, N,N-dimethylethanolamine, N,N-diethylethanolamine, triethylenediamine, N-methylpyrrolidine, N-ethylpyrrolidine, N-methylpiperidine, N-ethylpiperidine, imidazole, pyridine, quinoline, and isoquinoline.

The polyimide A solution preferably has a concentration of 1 to 50 wt. %, more preferably 10 to 40 wt. %.

The solution of polyimide A in organic solvent may further contain a surfactant such as a fluorine-containing surfactant or a polysiloxane-based surfactant. By virtue of the presence of a surfactant, polyimide film having high surface flatness can readily be produced.

Unstretched Polyimide Film

In the present invention, polyimide film is generally produced through the following procedure. Specifically, the solution of polyimide A in organic solvent prepared through any of the aforementioned methods is applied onto a support substrate such as a glass plate or a metallic plate and heated at 100° C. to 350° C. to thereby remove the solvent. The thus-formed film is peeled off from the substrate, to thereby produce an unstretched polyimide film (hereinafter referred to as "unstretched polyimide A film"), which is then stretched, to thereby produce the stretched polyimide film The amount of solvent remaining in unstretched polyimide A film can be controlled through appropriately regulating the time and temperature for heating performed after application of polyimide A onto a substrate. The unstretched polyimide A film preferably has a thickness of 4 to 400 μm.

In the present invention, a self-supporting unstretched polyimide A film having an organic solvent content, at the start of stretching, of 0.5 wt. % or more and less than 30 wt. % is employed.

In the production of a polyimide A having poor solubility in solvent, the corresponding unstretched polyimide A film may also be produced through the following procedure. Specifically, a tetracarboxylic dianhydride and a diamine are reacted in an organic solvent at room temperature to 50° C. to thereby form a polyamic acid, and the thus-formed dispersion of the polyamic acid in organic solvent is applied onto a substrate such as a glass plate or a metallic plate. The applied solution is dehydrated/imidized through heating at 200° C. to 350° C. Alternatively, the aforementioned polyamic acid dispersion in organic solvent is applied onto a substrate such as a glass plate or a metallic plate and chemically imidized by use of a dehydrating agent such as acetic anhydride, to thereby produce an unstretched polyimide A film.

Stretching of Unstretched Polyimide A Film

Generally, unstretched polyimide A film is stretched in the following manner: holding an unstretched film piece at the ends thereof by means of clips of a stretching machine, heating the film piece, and starting stretching when the temperature has reached a predetermined level.

In the present invention, stretching is performed under heating; i.e., generally at 150° C. or higher, particularly 200° C. or higher. Therefore, stretching is preferably performed in an inert gas atmosphere such as nitrogen, argon, or helium.

In film stretching, heating may be performed while tension is applied to the film. Alternatively, after completion of stretching, the film may be appropriately maintained under reduced pressure in order to remove solvent remaining in the film.

During the stretching; i.e., from the start of heating to completion of stretching, organic solvent is evaporated out from the unstretched polyimide A film. As a result, particularly when the film has high solvent content, the glass transition temperature of the unstretched polyimide A film drastically increases in accordance with the amount of vaporization. Excessively large organic solvent vaporization rates affect the formed unstretched polyimide A film. For example, foaming or generation of crater-like surface irregularities occurs in the film, glass transition temperature increases in a limited portion, or nonuniformity in stretching (e.g., streak-like irregularities) is caused by nonuniformity in glass transition temperature.

Therefore, according to the present invention, an unstretched polyimide A film having an organic solvent content of 0.5 wt. % or more and less than 30 wt. % is stretched at 150° C. to 380° C. and a stretch ratio of 1.2 to 4.0, to thereby produce the polyimide film of the invention.

In a more preferred manner, when the unstretched polyimide A film has an organic solvent content of 0.5 wt. % or more and less than 10 wt. %, the polyimide film of the invention is produced through stretching the unstretched polyimide A film at 220° C. to 380° C., reducing the stretch degree of the stretched film, maintaining the film at the reduced stretch degree, heating the film to a temperature higher than the stretch temperature by 1° C. to 50° C., and maintaining the heated film for 10 seconds to 10 minutes.

In the case of an unstretched polyimide A film having an organic solvent content of 0.5 wt. % or more and less than 10 wt. %, when stretching is performed at lower than 220° C., the stretched film becomes opaque or is broken, which is not preferred.

In a preferred manner, the stretch degree of the thus-stretched polyimide film is reduced, and the film is maintained at a reduced stretch degree and heated at a temperature higher than the stretching temperature by 1° to 50° C., preferably by 1° C. to 25° C., more preferably 2° C. to 15° C., for 10 seconds to 10 minutes, preferably for 15 seconds to 10 minutes, more preferably for 20 seconds to 5 minutes. As used herein, the expression "reducing the stretch degree" refers to reducing the distance between two clips at the end of the stretching, to less than 100%. Preferably, the stretch degree is 99.99% or less that at the end of stretching, more preferably 99.99% to 95.0%, particularly preferably 99.95% to 99.0%.

In the above treatment, polymer molecules which have been aligned in a predetermined direction by stretching are freely moved within limited segments virtually without changing the location and direction of the molecules. A conceivable mechanism of this treatment is as follows. In particular, polymer molecules adjacent to each other are aligned in a more stable state, and local stress generated between polymer molecules by stretching can be relaxed; i.e., structural defects can be removed, to thereby form more uniform stretched film. Through this treatment, tensile stress generated by stretching and remaining in the film can be minimized. When the polyimide film of the present invention is used at the same temperature as the heat treatment temperature, dimensional changes in the polyimide film can be minimized. In addition, during the treatment, the solvent is evaporated portion by portion, whereby a polyimide film having higher glass transition temperature can be formed.

When the maintenance time after stretching and re-heating is shorter than 10 seconds, effect of reducing dimensional changes cannot be fully attained, whereas when the maintenance time is longer than 10 minutes, productivity decreases. Needless to say, both cases are not preferred.

In a preferred manner, when the unstretched polyimide A film has an organic solvent content of 10 wt. % or more and less than 30 wt. %, the polyimide film of the invention is produced through stretching the unstretched polyimide A film at 150° C. to 300° C., maintaining the stretch degree of the stretch film, heating to a first temperature higher than the stretch temperature and lower than the glass transition temperature of the polyimide containing virtually no organic solvent, maintaining the heated film for 30 seconds to 30 minutes, reducing the stretch degree of the heated film, maintaining the film at the reduced stretch degree, heating again to a second temperature higher than the first temperature by 1° C. to 50° C., and maintaining the film for 10 seconds to 10 minutes.

In the case of an unstretched polyimide A film having an organic solvent content of 10 wt. % or more and less than 30 wt. %, when stretching is performed at lower than 150° C., the stretched film becomes opaque or is broken, whereas when the stretching temperature is higher than 300° C., solvent evaporation rate excessively increases, thereby readily providing surface defects. Needless to say, both cases are not preferred.

While the stretch degree of the stretch film is maintained, the film is heated again to a temperature higher than the stretch temperature preferably by 1° C. or more, more preferably by 2° C. or more, and lower than the glass transition temperature of the polyimide containing virtually no organic solvent preferably by 1° C. or more, more preferably by 2° C. or more, and the heated film is maintained at the temperature for 30 seconds to 30 minutes, preferably 30 seconds to 20 minutes, more preferably one minute to 15 minutes, to thereby remove residual solvent to less than 10 wt. %, more preferably less than 4 wt. %. The step of removing excessive solvent may further relax the above-attained polymer molecule alignment, and an excessively large vaporization rate may increase surface irregularities. Therefore, in a preferred mode, a predetermined set of parameters including the type of unstretched polyimide A film, the type and amount of residual solvent, and the glass transition temperature of the polyimide A film is determined in advance, and the time of temperature elevation and the time of retention are controlled in accordance with the determined parameters.

Similar to the case of the aforementioned unstretched polyimide film having an organic solvent of 0.5 wt. % or more and less than 10 wt. %, the similar polyimide film can be produced through the aforementioned steps. Thus, similar to the above case, in a preferred mode, the film is maintained at a reduced stretch degree, a stretch degree of 99.99% or less that at the end of stretching, more preferably 99.99% to 95.0%, particularly 99.95% to 99.0%; heated again to a second temperature higher than the aforementioned first temperature by 1° C. to 50° C., preferably 1° C. to 25° C., more preferably 2° C. to 15° C.; and maintained at the second temperature for 10 seconds to 10 minutes, preferably 15 seconds to 10 minutes, more preferably 20 seconds to 5 minutes.

Stretching may be so-called successive biaxial stretching including stretching in a longitudinal direction, followed by stretching in a lateral direction, or so-called simultaneous biaxial stretching in which stretching in a longitudinal and in a lateral direction are simultaneously performed. Any of industrially produced successive biaxial stretching machines and simultaneous biaxial stretching machines may be employed as a stretching machine.

According to the present invention, the stretch ratio is 1.2 to 4.0, preferably 1.2 to 3.0. When the stretch ratio is less than 1.2, effect of reducing percent dimensional change in response to changes in temperature and humidity cannot fully be attained, whereas when the stretch ratio is more than 4.0, the formed polyimide film has variation in thickness and breakage starts from a thin portion. Thus both cases are not preferred.

Through stretching of unstretched polyimide A film under the aforementioned conditions, percent dimensional change of produced film in response to changes in temperature and humidity of film can be reduced. For example, a polyimide film which has been stretched and heat-treated under the aforementioned conditions exhibits a linear expansion coefficient of 50 ppm/° C. or less, a moisture expansion coefficient (25° C.) of 40 ppm/% RH or less, a tensile modulus (25° C.) of 1.7 GPa or more, and a tensile strength of 90 MPa or more.

The polyimide film produced according to the present invention exhibits excellent transparency, heat resistance, and dimensional stability, and thus can be employed, in electronic elements, as a transparent conductive film, a thin-film transistor substrate, a flexible printed wiring board, etc.

In the production of these electronic elements, when the material exhibits large expansion and shrinkage caused by heating, the produced elements are deteriorated. Therefore, such a material is required to have excellent dimensional stability. The material preferably has a linear expansion coefficient in a heated state of less than 50 ppm/° C.

EXAMPLES

The film samples produced in the Examples and Comparative Examples were evaluated as follows (1) Glass Transition Temperature (Tg)

Glass transition temperature was determined through DSC by means of a differential scanning calorimeter (DSC-50, product of Shimadzu Corporation) at a temperature elevation rate of 10° C./min.

(2) Linear Expansion Coefficient

Linear expansion coefficient was determined by means of a thermo-mechanical analyzer (TMA100, product of Seiko Instruments Inc.) at a load of 50 mN and a temperature elevation rate of 10° C./min. The coefficient was an average of those determined at 100° C. to 150° C.

(3) Total Light Transmittance

Total light transmittance was determined in accordance with JIS K7105 by means a haze-meter (Z-Σ80, product of Nippon Denshoku Industries Co., Ltd.).

(4) Residual Solvent Ratio

Residual solvent ratio was determined through TGA by means of a thermogravimetric analyzer (DTG-50, product of Shimadzu Corporation) under a stream of nitrogen at a temperature elevating rate of 15° C./min. The ratio was determined from the total weight loss measured during temperature elevation of 150° C. to 300° C. for 10 min and during temperature maintenance at 300° C. for 30 min (40 minutes in total).

(5) Moisture Expansion Coefficient

Each film sample was maintained at 23° C. and an RH of 3% for 24 hours and, subsequently, left to stand at 23° C. and an RH of 90% for 24 hours. The moisture expansion coefficient was determined from dimensional changes of the film sample.

(6) Tensile Strength and Tensile Modulus

Tensile strength and tensile modulus were determined in accordance with JIS K7127 by means of a tension tester (Strograph VI-1, product of Toyo Seiki Seisaku-sho Co., Ltd.).

Referential Example 1

Production of 1,2,4,5-cyclohexanetetracarboxylic Dianhydride

Into an autoclave (capacity: 5 L) made of Hastelloy HC22, pyromellitic acid (552 g), a rhodium-on-activated carbon catalyst (product of N.E. Chemcat Corporation) (200 g), and water (1,656 g) were fed. The reactor was purged with nitrogen while the mixture was stirred.

Subsequently, the reactor was purged with hydrogen, and the hydrogen pressure in the reactor was adjusted to 5.0 MPa. The reactor temperature was elevated to 60° C., and the mixture was allowed react for two hours while the hydrogen pressure was maintained at 5.0 MPa. The hydrogen atmosphere in the reactor was substituted by nitrogen, and the reaction mixture was removed from the autoclave. The reaction mixture was filtered in a hot state, to thereby remove the catalyst. The filtrate was concentrated through evaporation of water under reduced pressure by means of a rotary evaporator, to thereby precipitate crystals. The thus-precipitated crystals were separated from the liquid at room temperature and dried, to thereby yield 481 g of 1,2,4,5-cyclohexanetetracarboxylic acid (yield: 85.0%).

Subsequently, the produced 1,2,4,5-cyclohexanetetracarboxylic acid (450 g) and acetic anhydride (4,000 g) were fed to a glass-made separable flask (capacity: 5 L, equipped with a Dimroth condenser), and the reactor was purged with nitrogen while the mixture was stirred. Under nitrogen, the mixture was heated to the reflux temperature of the solvent, and the solvent was refluxed for 10 minutes. Then, the mixture was cooled to room temperature under stirring, to thereby precipitate crystals. The thus-precipitated crystals were separated from the liquid and dried, to thereby yield primary crystals. The filtrate was further concentrated under reduced pressure by means of a rotary evaporator, to thereby precipitate crystals. The thus-precipitated crystals were separated from the liquid and dried, to thereby yield secondary crystals.

Through combination of the primary and secondary crystals, 1,2,4,5-cyclohexanetetracarboxylic dianhydride (375 g, anhydride yield: 96.6%) was produced. The target product (1,2,4,5-cyclohexanetetracarboxylic dianhydride) was found to have a purity of 99.5%.

Referential Example 2

Production of Polyimide A-1 Solution

Into a five-necked flask (capacity: 500 mL) equipped with a thermometer, a stirrer, a nitrogen conduit, a branched dropping funnel, a Dean-Stark tube, and a condenser, 4,4'-diaminodiphenyl ether 10.0 g (0.05 mol) and N-methyl-2-pyrrolidone (85 g) serving as a solvent were fed under a stream of nitrogen. After dissolution, 1,2,4,5-cyclohexanetetracarboxylic dianhydride (11.2 g, 0.05 mol) in the solid form, synthesized in Referential Example 1, was added portionwise to the flask at room temperature over one hour, and the mixture was stirred at room temperature for two hours.

Subsequently, xylene (30.0 g), serving as a co-boiling/dehydrating solvent, was added to the flask, and the mixture was heated to 180° C. and allowed to react for three hours.

Xylene was refluxed by means of the Dean-Stark tube, whereby co-boiled water was removed. Three hours after refluxing, termination of water evaporation was confirmed, and xylene was removed through heating to 190° C. over one hour (29.0 g collected). The liquid was allowed to stand to cool to an inner temperature of 60° C., to thereby yield a solution (105.4 g) of polyimide in N-methyl-2-pyrrolidone (hereinafter referred to as polyimide A-1 solution).

The thus-produced polyimide A-1 solution was applied to a glass plate, and the plate was heated on a hot-plate at 90° C. for one hour, to thereby evaporate the solvent. The formed film was removed from the glass plate, to thereby produce a self-supporting film. The self-supporting film was held by a stainless steel supporting jig and dried in vacuum at 200° C. for five hours. Under a stream of nitrogen, the film was further heated at 220° C. for five hours so as to further evaporate the solvent, to thereby form a colorless, transparent, and flexible film having a thickness of 100 μm.

An IR spectrum of the film was found to have characteristic absorption peaks attributed to an imide ring at 1772 cm$^{-1}$ and 1700 cm$^{-1}$ (ν(C=O)). The produced unstretched polyimide film was found to have a solvent content of 0.4 wt. %, a glass transition temperature of 315° C., and a total light transmittance of 90%.

Example 1

The polyimide A-1 solution produced in Referential Example 2 was applied to a glass plate, and the plate was heated on a hot-plate at 90° C. for one hour, to thereby evaporate the solvent. The formed film was removed from the glass plate, to thereby produce a self-supporting film. The self-supporting film was held to a stainless steel supporting jig and heated at 220° C. for five hours under a stream of nitrogen so as to further evaporate the solvent, to thereby form an unstretched polyimide A-1 film which was a colorless, transparent, and flexible and which had a thickness of 100 μm and a residual solvent ratio of 4.0 wt. %.

The film was cut to provide film pieces (12 cm×12 cm), and each piece was set in a polymer film biaxial stretching machine (SS-80, product of Shibayama Scientific Co., Ltd.).

Under a stream of nitrogen, each piece of the unstretched polyimide A-1 film was heated to 350° C. and maintained at 350° C. for 10 minutes. Subsequently, the piece was simultaneously biaxially stretched at 15 mm/min to a stretch ratio of 1.8. Then, the distance between two clips at the end of the stretching was reduced to 99.9%, and the piece was heated to 355° C. and maintained at 355° C. for 30 seconds.

The film piece was cooled and removed from the stretching machine. Physical properties of the piece were determined. The obtained polyimide film piece was found to exhibit a residual solvent ratio of 0.1 wt. %, a linear expansion coefficient of 25 ppm/° C., a moisture expansion coefficient of 32 ppm/% RH, a tensile modulus of 2.0 GPa, and a tensile strength of 105 MPa.

Example 2

The polyimide A-1 solution produced in Referential Example 2 was applied to a glass plate, and the plate was heated on a hot-plate at 90° C. for one hour, to thereby evaporate the solvent. The formed film was removed from the glass plate, to thereby produce a self-supporting film. The self-supporting film was held to a stainless steel supporting jig and heated at 160° C. for 20 minutes under a stream of nitrogen so as to further evaporate the solvent, to thereby form an unstretched polyimide A-2 film which was a colorless, transparent, and flexible and which had a thickness of 100 μm and a residual solvent ratio of 15 wt. %.

The unstretched polyimide A-2 film was cut to provide film pieces (12 cm×12 cm), and each piece was set in the aforementioned polymer film biaxial stretching machine. Under a stream of nitrogen, each piece of the unstretched polyimide A-2 film was heated to 180° C., and simultaneously biaxially stretched at 15 mm/min to a stretch ratio of 1.8. While the film piece was maintained in a location at the end of stretching, the piece was heated to 250° C. at 7° C./min and maintained at 250° C. for 10 minutes. Subsequently, the distance between two clips at the end of the stretching was reduced to 99.9%, and the piece was heated to 255° C. and maintained at 255° C. for 30 seconds.

The film piece was cooled and removed from the stretching machine. Physical properties of the piece were determined. The obtained polyimide film piece was found to exhibit a residual solvent ratio of 0.9 wt. %, a linear expansion coefficient of 27 ppm/° C., a moisture expansion coefficient of 35 ppm/% RH, a tensile modulus of 1.9 GPa, and a tensile strength of 102 MPa.

Example 3

The procedure of Example 1 was repeated, except that simultaneous biaxial stretching was performed at a stretch ratio of 1.4, to thereby produce a polyimide film.

The obtained polyimide film piece was found to exhibit a residual solvent ratio of 0.1 wt. %, a linear expansion coefficient of 34 μm/° C., a moisture expansion coefficient of 39 ppm/% RH, a tensile modulus of 1.9 GPa, and a tensile strength of 102 MPa.

Comparative Example 1

The procedure of Example 1 was repeated, except that simultaneous biaxial stretching was performed at a stretch ratio of 1.1, to thereby produce a polyimide film.

The obtained polyimide film piece was found to exhibit a residual solvent ratio of 0.1 wt. %, a linear expansion coefficient of 52 ppm/° C., a moisture expansion coefficient of 45 ppm/% RH, a tensile modulus of 1.5 GPa, and a tensile strength of 85 MPa.

Comparative Example 2

In an attempt to produce biaxially stretched polyimide film, the procedure of Example 2 was repeated, except that the stretching temperature was changed to 140° C. Unsuccessfully, the film could not be stretched due to tear during stretching.

Referential Example 3

The procedure of Referential Example 2 was repeated, except that α,α'-bis(4-aminophenyl)-1,4-diisopropylbenzene 12.1 g (0.035 mol) and 4,4'-bis(4-aminophenoxy)biphenyl (5.5 g, 0.015 mol) were used instead of 4,4'-diaminodiphenyl ether (10.0 g, 0.05 mol), to thereby produce a solution (113.0 g) of a polyimide in N-methyl-2-pyrrolidone (hereinafter referred to as polyimide A-3 solution).

The thus-produced polyimide A-3 solution was applied to a glass plate, and the plate was heated on a hot-plate at 90° C. for one hour, to thereby evaporate the solvent. The formed film was removed from the glass plate, to thereby produce a self-supporting film. The self-supporting film was held by a stainless steel supporting jig and dried in vacuum at 200° C.

for five hours. Under a stream of nitrogen, the film was further heated at 220° C. for five hours so as to further evaporate the solvent, to thereby form a colorless, transparent, and flexible film having a thickness of 100 μm.

An IR spectrum of the film was found to have characteristic absorption peaks attributed to an imide ring were observed at 1772 cm$^{-1}$ and 1700 cm$^{-1}$ (ν(C=O)). The produced unstretched polyimide film was found to have a solvent content of 0.3 wt. %, a glass transition temperature of 303° C., and a total light transmittance of 90%.

Example 4

The polyimide A-3 solution produced in Referential Example 3 was applied to a glass plate, and the plate was heated on a hot-plate at 90° C. for one hour, to thereby evaporate the solvent. The formed film was removed from the glass plate, to thereby produce a self-supporting film. The self-supporting film was held to a stainless steel supporting jig and heated at 220° C. for five hours under a stream of nitrogen so as to further evaporate the solvent, to thereby form an unstretched polyimide A-3 film which was a colorless, transparent, and flexible and which had a thickness of 100 μm and a residual solvent ratio of 3.0 wt. %.

The film was cut to provide film pieces (12 cm×12 cm), and each piece was set in a polymer film biaxial stretching machine (SS-80, product of Shibayama Scientific Co., Ltd.). Under a stream of nitrogen, each piece of the unstretched polyimide A-3 film was heated to 320° C. and maintained at 320° C. for 10 minutes. Subsequently, the piece was simultaneously biaxially stretched at 15 mm/min to a stretch ratio of 1.8. Then, the distance between two clips at the end of the stretching was reduced to 99.9%, and the piece was heated to 325° C. and maintained at 325° C. for 30 seconds.

Physical properties of the piece were determined. The obtained polyimide film piece was found to exhibit a residual solvent ratio of 0.1 wt. %, a linear expansion coefficient of 30 ppm/° C., a moisture expansion coefficient of 38 ppm/% RH, a tensile modulus of 1.9 GPa, and a tensile strength of 99 MPa.

Comparative Example 3

The procedure of Example 4 was repeated, except that simultaneous biaxial stretching was performed at a stretch ratio of 1.1, to thereby produce a polyimide film.

The obtained polyimide film piece was found to exhibit a residual solvent ratio of 0.1 wt. %, a linear expansion coefficient of 58 ppm/° C., a moisture expansion coefficient of 70 ppm/% RH, a tensile modulus of 1.4 GPa, and a tensile strength of 80 MPa.

Referential Example 4

The procedure of Referential Example 2 was repeated, except that 2,2-bis(4-aminophenoxyphenyl)propane (20.5 g, 0.05 mol) was used instead of 4,4'-diaminodiphenyl ether (10.0 g, 0.05 mol), to thereby produce a solution (115.9 g) of polyimide A in N-methyl-2-pyrrolidone (hereinafter referred to as polyimide A-4 solution).

The thus-produced polyimide A-4 solution was applied to a glass plate, and the plate was heated on a hot-plate at 90° C. for one hour, to thereby evaporate the solvent. The formed film was removed from the glass plate, to thereby produce a self-supporting film. The self-supporting film was held by a stainless steel supporting jig and dried in vacuum at 200° C. for five hours. Under a stream of nitrogen, the film was further heated at 220° C. for five hours so as to further evaporate the solvent, to thereby form a colorless, transparent, and flexible film having a thickness of 100 μm.

An IR spectrum of the film was found to have characteristic absorption peaks attributed to an imide ring were observed at 1772 cm$^{-1}$ and 1700 cm$^{-1}$ (ν(C=O)). The produced unstretched polyimide film was found to have a solvent content of 0.3 wt. %, a glass transition temperature of 263° C., and a total light transmittance of 90%.

Example 5

The polyimide A-4 solution produced in Referential Example 4 was applied to a glass plate, and the plate was heated on a hot-plate at 90° C. for one hour, to thereby evaporate the solvent. The formed film was removed from the glass plate, to thereby produce a self-supporting film. The self-supporting film was held to a stainless steel supporting jig and heated at 220° C. for five hours under a stream of nitrogen so as to further evaporate the solvent, to thereby form an unstretched polyimide A-4 film which was a colorless, transparent, and flexible and which had a thickness of 100 μm and a residual solvent ratio of 4.0 wt. %.

The film was cut to provide film pieces (12 cm×12 cm), and each piece was set in the aforementioned polymer film biaxial stretching machine. Under a stream of nitrogen, each piece of the unstretched polyimide A-4 film was heated to 280° C. and maintained at 280° C. for 10 minutes. Subsequently, the piece was simultaneously biaxially stretched at 15 mm/min to a stretch ratio of 1.4. Then, the distance between two clips at the end of the stretching was reduced to 99.9%, and the piece was heated to 285° C. and maintained at 285° C. for 30 seconds.

Physical properties of the piece were determined. The obtained polyimide film piece was found to exhibit a residual solvent ratio of 0.1 wt. %, a linear expansion coefficient of 40 ppm/° C., a moisture expansion coefficient of 30 ppm/% RH, a tensile modulus of 2.3 GPa, and a tensile strength of 91 MPa.

Example 6

The procedure of Example 5 was repeated, except that simultaneous biaxial stretching was performed at a stretch ratio of 2.5, to thereby produce a polyimide film.

The obtained polyimide film piece was found to exhibit a residual solvent ratio of 0.1 wt. %, a linear expansion coefficient of 22 ppm/° C., a moisture expansion coefficient of 28 ppm/% RH, a tensile modulus of 2.4 GPa, and a tensile strength of 100 MPa.

Comparative Example 4

The procedure of Example 5 was repeated, except that simultaneous biaxial stretching was performed at a stretch ratio of 1.1, to thereby produce a polyimide film.

The obtained polyimide film piece was found to exhibit a residual solvent ratio of 0.1 wt. %, a linear expansion coefficient of 54 ppm/° C., a moisture expansion coefficient of 42 ppm/% RH, a tensile modulus of 2.2 GPa, and a tensile strength of 87 MPa.

INDUSTRIAL APPLICABILITY

According to the present invention, a polyimide film which is colorless and transparency and which exhibits excellent heat resistance and reduced dimensional changes can be produced. By virtue of these properties, the polyimide film can be employed as a transparent conductive film, a transparent thin-film transistor substrate, a flexible printed wiring board, etc.

The invention claimed is:

1. A process for producing polyimide film, comprising stretching at a stretch ratio of 1.2 to 4.0, an unstretched polyimide film which is formed of a polyimide having a repeating unit represented by formula (1):

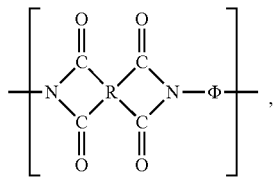

(1)

wherein R represents a tetravalent group derived from cyclohexane; and Φ represents a divalent aliphatic, alicyclic, or aromatic group, or a combination thereof that has a total number of carbon atoms of 2 to 39 and may have at least one connecting group selected from the group consisting of —O—, —SO$_2$—, —CO—, —CH$_2$—, —C(CH$_3$)$_2$—, —OSi(CH$_3$)$_2$—, —C$_2$H$_4$O—, and —S—, and wherein the unstretched polyimide film which has an organic solvent content of 0.5 wt. % or more and less than 10 wt. % is stretched at 220° C. to 380° C., and the process further includes reducing the stretch degree of the stretched film, maintaining the film at the reduced stretch degree, heating the film to a temperature higher than the stretch temperature by 1° C. to 50° C., and maintaining the heated film for 10 seconds to 10 minutes.

2. A process for producing polyimide film as described in claim 1, wherein the polyimide film has a linear expansion coefficient of 50 ppm/° C. or less.

3. A process for producing polyimide film as described in claim 1, wherein the polyimide film has a moisture expansion coefficient of 40 ppm/ % RH or less as determined at 25° C.

4. A process for producing polyimide film as described in claim 1, wherein the polyimide film has a tensile modulus of 1.7 GPa or more and a tensile strength of 90 MPa or more, as determined at 25° C.

5. A process for producing polyimide film as described in claim 1, wherein R is a cyclohexanetetrayl group.

6. A process for producing polyimide film as described in claim 5, wherein R is a tetravalent group formed from 1,2,4,5-cyclohexanetetracarboxylic dianhydride or a reactive derivative thereof.

7. A process for producing polyimide film, comprising stretching, at a stretch ratio of 1.2 to 4.0, an unstretched polyimide film which is formed of a polyimide having a repeating unit represented by formula (1):

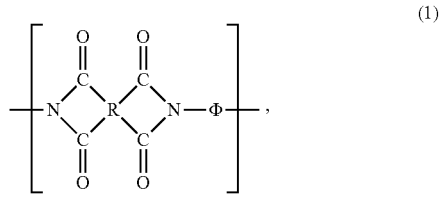

(1)

wherein R represents a tetravalent group derived from cyclohexane; and Φ represents a divalent aliphatic, alicyclic, or aromatic group, or a combination thereof that has a total number of carbon atoms of 2 to 39 and may have at least one connecting group selected from the group consisting of —O—, —SO$_2$—, —CO—, —CH$_2$—, —C(CH$_3$)$_2$—, —OSi(CH$_3$)$_2$—, —C$_2$H$_4$O—, and —S—, and wherein the unstretched polyimide film which has an organic solvent content of 10 wt. % or more and less than 30 wt. % is stretched at 150° C. to 300° C., and the process further includes maintaining the stretch degree of the stretched film, heating the stretched film to a first temperature higher than the stretch temperature and lower than the glass transition temperature of the polyimide containing virtually no organic solvent, maintaining the heated film for 30 seconds to 30 minutes, reducing the stretch degree of the heated film, maintaining the film at the reduced stretch degree, heating again to a second temperature higher than the first temperature by 1° C. to 50° C., and maintaining the heated film for 10 seconds to 10 minutes.

8. A process for producing polyimide film as described in claim 7, wherein the polyimide film has a linear expansion coefficient of 50 ppm/° C. or less.

9. A process for producing polyimide film as described in claim 7, wherein the polyimide film has a moisture expansion coefficient of 40 ppm/ % RH or less as determined at 25° C.

10. A process for producing polyimide film as described in claim 7, wherein the polyimide film has a tensile modulus of 1.7 GPa or more and a tensile strength of 90 MPa or more, as determined at 25° C.

11. A process for producing polyimide film as described in claim 7, wherein R is a cyclohexanetetrayl group.

12. A process for producing polyimide film as described in claim 11, wherein R is a tetravalent group formed from 1,2,4,5-cyclohexanetetracarboxylic dianhydride or a reactive derivative thereof.

* * * * *